United States Patent
Takada et al.

(10) Patent No.: US 8,643,765 B2
(45) Date of Patent: Feb. 4, 2014

(54) IMAGE PICK-UP APPARATUS AND IMAGE PICK-UP SYSTEM WITH OVERLAPPING EXPOSURE AREAS

(75) Inventors: Hideaki Takada, Atsugi (JP); Akira Okita, Yamato (JP); Hiroki Hiyama, Zama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/052,257

(22) Filed: Mar. 21, 2011

(65) Prior Publication Data

US 2011/0169996 A1 Jul. 14, 2011

Related U.S. Application Data

(63) Continuation of application No. 11/047,562, filed on Feb. 2, 2005, now abandoned.

(30) Foreign Application Priority Data

Feb. 6, 2004 (JP) ................................. 2004-030814

(51) Int. Cl.
*H04N 5/225* (2006.01)

(52) U.S. Cl.
USPC ............ 348/340; 348/294; 348/296; 348/362

(58) Field of Classification Search
USPC .......................... 348/272, 340, 296, 362, 294
See application file for complete search history.

(56) References Cited

U.S. PATENT DOCUMENTS

| | | | |
|---|---|---|---|
| 5,107,280 A | 4/1992 | Ohashi et al. ................. | 346/108 |
| 5,381,208 A | 1/1995 | Takagi ........................... | 354/415 |
| 5,527,649 A | 6/1996 | Sato et al. ......................... | 430/7 |
| 5,561,317 A | 10/1996 | Momma et al. ................. | 257/620 |
| 5,682,203 A | 10/1997 | Kato ............................. | 348/340 |
| 5,731,131 A | 3/1998 | Momma et al. ................ | 430/311 |
| 5,948,577 A | 9/1999 | Nakazawa et al. ................. | 430/7 |
| 6,057,538 A | 5/2000 | Clarke ........................ | 250/208.1 |
| 6,188,094 B1 | 2/2001 | Kochi et al. .................... | 257/232 |
| 6,605,850 B1 | 8/2003 | Kochi et al. .................... | 257/431 |
| 6,665,010 B1 | 12/2003 | Morris et al. ................. | 348/297 |
| 6,670,990 B1 | 12/2003 | Kochi et al. .................... | 348/310 |
| 6,946,637 B2 | 9/2005 | Kochi et al. ................. | 250/208.1 |
| 6,960,751 B2 | 11/2005 | Hiyama et al. ............. | 250/208.1 |
| 7,087,983 B2 | 8/2006 | Itano et al. .................... | 257/664 |

(Continued)

FOREIGN PATENT DOCUMENTS

| | | |
|---|---|---|
| EP | 1 213 764 A2 | 6/2002 |
| JP | 5-6849 | 1/1993 |
| JP | 2003-298040 A | 10/2003 |

*Primary Examiner* — Usman Khan

(74) *Attorney, Agent, or Firm* — Fitzpatrick, Cella, Harper & Scinto

(57) ABSTRACT

An output level difference in the case of using a joint line as a boundary, a bright line, a black bar, or the like is suppressed. A solid-state image pick-up apparatus in which, on a substrate having a plurality of photoelectric converting areas (photodiodes), a solid-state image pick-up element provided with at least one pattern layer formed by divisional exposure and a lens for introducing light into the plurality of photoelectric converting areas of the solid-state image pick-up element are formed. By setting a center of an optical axis of the lens to an approximate joint position between the pattern layers where the pattern layers have been joined by the divisional exposure, the output level difference of a pixel output of the solid-state image pick-up element on the right and left sides of the joint position is suppressed.

25 Claims, 12 Drawing Sheets

(56) References Cited

U.S. PATENT DOCUMENTS

| | | |
|---|---|---|
| 7,110,030 B1 | 9/2006 | Kochi et al. .................... 348/308 |
| 7,388,653 B2 | 6/2008 | Kim ................................ 355/77 |
| 7,466,003 B2 | 12/2008 | Ueno et al. .................... 257/462 |
| 7,538,810 B2 | 5/2009 | Koizumi et al. ............. 348/308 |
| 7,872,286 B2 | 1/2011 | Okita et al. .................... 257/291 |
| 2001/0026322 A1 | 10/2001 | Takahashi et al. ............ 348/340 |
| 2003/0025820 A1 | 2/2003 | Miyahara ...................... 348/323 |
| 2003/0164887 A1 | 9/2003 | Koizumi et al. .............. 348/308 |
| 2004/0090538 A1* | 5/2004 | Kadohara .................. 348/230.1 |
| 2004/0125230 A1 | 7/2004 | Suda ............................. 348/345 |
| 2004/0126934 A1 | 7/2004 | Itano et al. .................... 438/129 |
| 2005/0098805 A1 | 5/2005 | Okita et al. ................... 257/292 |
| 2005/0122418 A1 | 6/2005 | Okita et al. .................... 348/340 |
| 2005/0168618 A1 | 8/2005 | Okita et al. .................... 348/335 |
| 2005/0179796 A1 | 8/2005 | Okita et al. .................... 348/308 |
| 2005/0268960 A1 | 12/2005 | Hiyama et al. ................ 136/244 |
| 2006/0043261 A1 | 3/2006 | Matsuda et al. ............ 250/208.1 |
| 2006/0043393 A1 | 3/2006 | Okita et al. ..................... 257/93 |
| 2006/0043440 A1 | 3/2006 | Hiyama et al. ................ 257/291 |
| 2006/0044434 A1 | 3/2006 | Okita et al. .................... 348/294 |
| 2006/0044439 A1 | 3/2006 | Hiyama et al. ................ 348/308 |

* cited by examiner

IMAGE PICK-UP APPARATUS AND IMAGE PICK-UP SYSTEM WITH OVERLAPPING EXPOSURE AREAS

CROSS REFERENCE TO RELATED APPLICATION

This application is a continuation of U.S. application Ser. No. 11/047,562 filed on Feb. 2, 2005, the entire disclosure of which is incorporated herein by reference.

BACKGROUND OF THE INVENTION

1. Field of the Invention

The invention relates to an image pick-up apparatus. More particularly, the invention relates to an image pick-up apparatus in which, on a substrate having a plurality of photoelectric converting areas, a solid-state image pick-up element provided with at least one pattern layer formed by divisional exposure and a lens for inputting light into the plurality of photoelectric converting areas of the solid-state image pick-up element are formed and to an image pick-up system.

2. Related Background Art

When a fine pattern has to be formed over a large area, for example, when a large-sized solid-state image pick-up apparatus is formed, a technique called a divisional exposing technique is used for exposing a pattern of a large area. As an example of such a technique, Japanese Patent Application Laid-Open No. H05-006849 (corresponding to U.S. Pat. Nos. 5,561,317 and 5,731,131) can be mentioned. FIG. 8 is a diagram for explaining the case where an image pick-up element of a size larger than an exposure area of a reduction projecting apparatus is divided into halves and exposed. FIG. 9 is a diagram showing a schematic construction of the reduction projecting apparatus.

In FIG. 8, reference numeral 103 denotes an image pick-up element of a size larger than the exposure area of the reduction projecting apparatus; 104 an effective pixel area (pixel area used as data to actually form an image excluding an optical black pixel area or the like); 105R an exposure area of a right reticule; and 105L an exposure area of a left reticule. The image pick-up element 103 is formed by joining the exposure areas 105R and 105L and divisionally exposing them. In the diagram, a joint line at a joint position of the solid-state image pick-up element (boundary line where patterns are joined in an overlapped portion of the exposure area 105R of the right reticule and the exposure area 105L of the left reticule) is shown.

In the reduction projecting apparatus shown in FIG. 9, light from a light source 230 passes through a condenser lens 240, a reticule 250, and a projection lens 260 and is projected as pattern light onto a wafer 220 on a stage 200 through a pattern 251 formed on the reticule 250, so that an image pick-up element chip 210 is formed. The stage 200 is movable in the X-Y directions. The divisional exposure is executed by exchanging the reticule and moving the stage 200. Although the case of the 2-divisional exposure has been explained here, there is also a case where 3-divisional exposure or 6-divisional exposure is executed.

On assembling the solid-state image pick-up element 103 into a solid-state image pick-up apparatus 310 such as a still camera or the like as shown in FIG. 10, if a center of an optical axis of a lens 300 of the still camera does not fall on the joint line at the joint position of the solid-state image pick-up element (boundary line where the patterns are joined in the overlapped portion of the exposure area 105R of the right reticule and the exposure area 105L of the left reticule as shown in FIG. 8) but is arranged in the position spaced from the joint line as shown in FIG. 11, the following problem occurs: that is, an output level difference, a bright line, a black bar, or the like is liable to be conspicuous in the right or left portions of the joint line. Details of such a problem will be explained in the description of the invention.

SUMMARY OF THE INVENTION

It is an object of the invention to provide a solid-state image pick-up apparatus in which, on a substrate having a plurality of photoelectric converting areas, a solid-state image pick-up element provided with at least one pattern layer formed by divisional exposure and a lens for introducing light into the plurality of photoelectric converting areas of the solid-state image pick-up element are formed, wherein a center of an optical axis of the lens is set onto an approximate joint line of a joint position where the pattern layers have been joined by the divisional exposure of the pattern layer.

As shown in FIG. 15, the joint position denotes a position where by synthesis of a pattern 1001R' of a first reticule 250R and a pattern 1001L' of a second reticule 250L, a pattern 1001R formed on the substrate (pattern formed by reduction-projecting the pattern 1001R' on the reticule) and a pattern 1001L formed on the substrate (pattern formed by reduction-projecting the pattern 1001L' on the reticule) are joined. The joint line denotes a boundary line where the patterns 1001R and 1001L are joined. The joint line is not necessarily a straight line. If they are not joined in edge portions of the patterns 1001L' and 1001R' on the reticules but are joined so as to have an overlapped portion, the joint line denotes such an overlapped portion.

Other features and advantages of the present invention will be apparent from the following description taken in conjunction with the accompanying drawings, in which like reference characters designate the same or similar parts throughout the figures thereof.

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Figure 12:
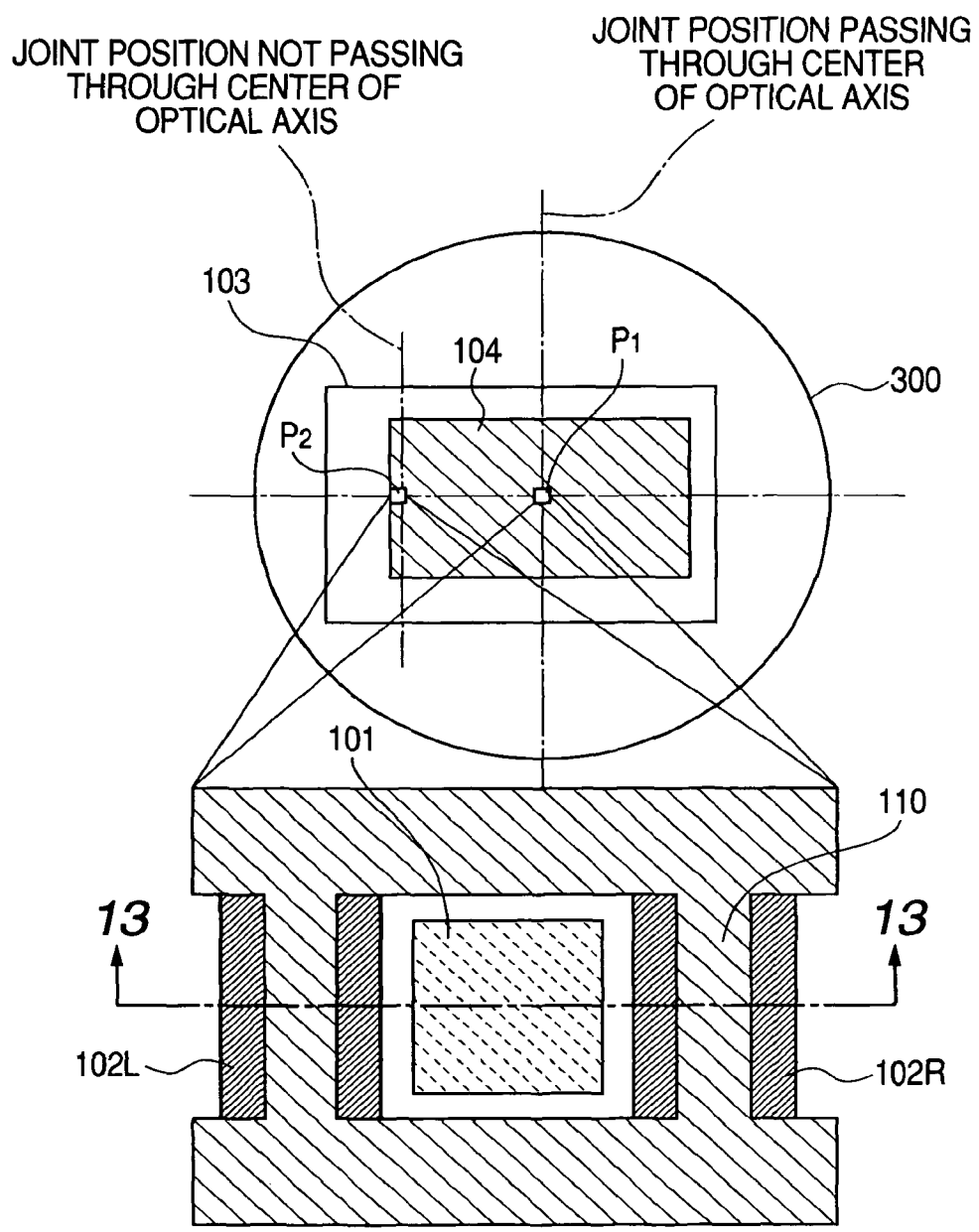
FIG. 12 is a diagram for explaining a difference between the case where the joint position of the solid-state image pick-up element passes through a part of the center of the optical axis and the case where it does not pass.

The invention will be described hereinbelow. As shown in FIG. 12, when a pixel P1 (of the solid-state image pick-up apparatus) locating at the center of the optical axis of a lens for converging the light onto the solid-state image pick-up element 103 and a pixel P2 (of the solid-state image pick-up apparatus) existing at a position spaced from the center of the optical axis of the lens are considered, as shown in FIG. 13 as a cross sectional view taken along the line 13-13 in FIG. 12, as for a main light beam incident in the pixel, the light enters perpendicularly (shown by arrows of solid lines in the diagram) the pixel P1 and the light enters the pixel P2 in the direction that is inclined from the perpendicular direction (shown by arrows of broken lines in the diagram) by the convergence through the lens as compared with the case of the pixel P1.

Therefore, when the solid-state image pick-up apparatus is formed by the divisional exposure, if the joint line of the solid-state image pick-up apparatus is located at the center of the optical axis of the lens, the light beam enters perpendicularly the pixel P1 which falls on the joint line and enters a PN junction area. On the other hand, if the joint line of the solid-state image pick-up apparatus is spaced from the center of the optical axis of the lens, the light beam enters the pixel P2 existing on the joint line in the direction inclined from the perpendicular direction.

Figure 13:
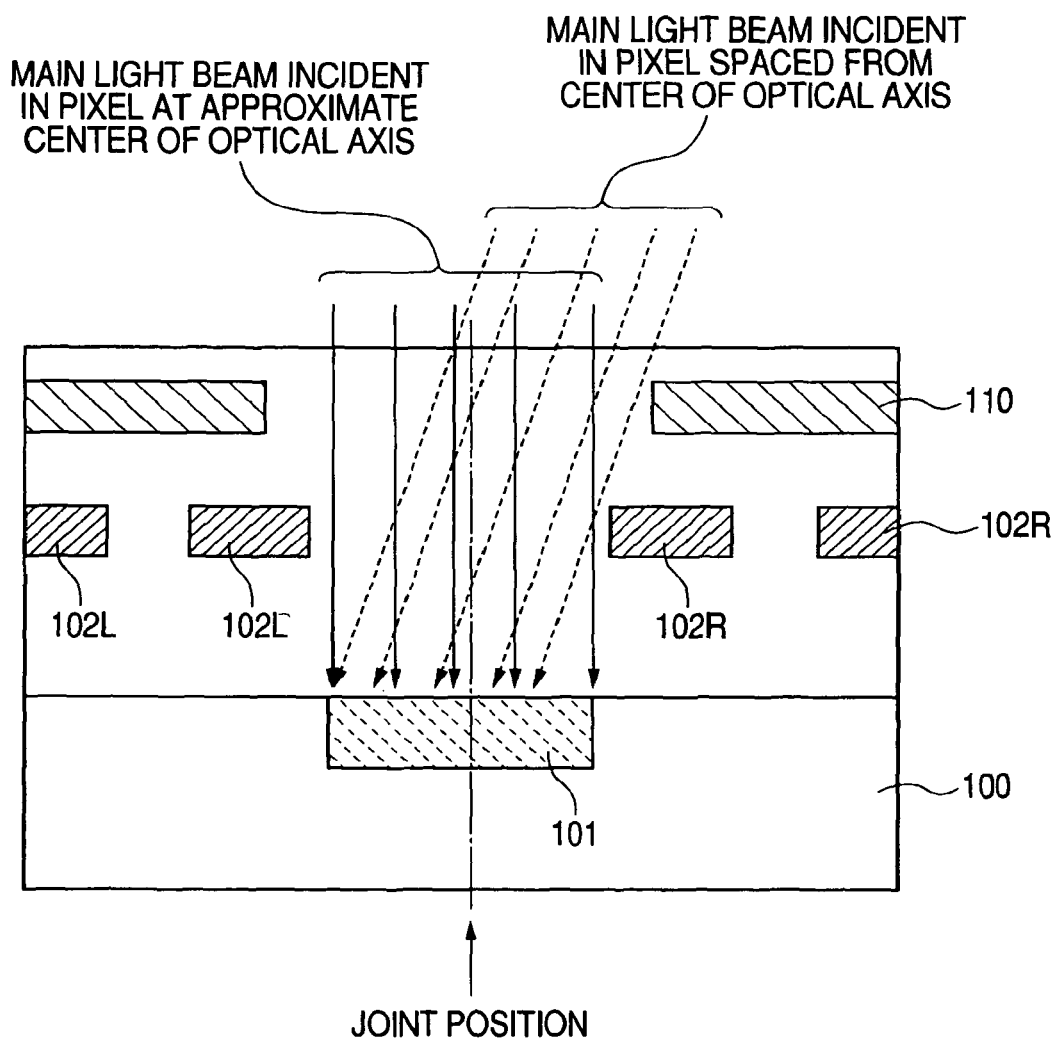
FIG. 13 is a diagram showing a state of a light beam incident in a pixel when exposure can be performed without any displacement to the right or left at the time of divisional exposure.
Figure 14:
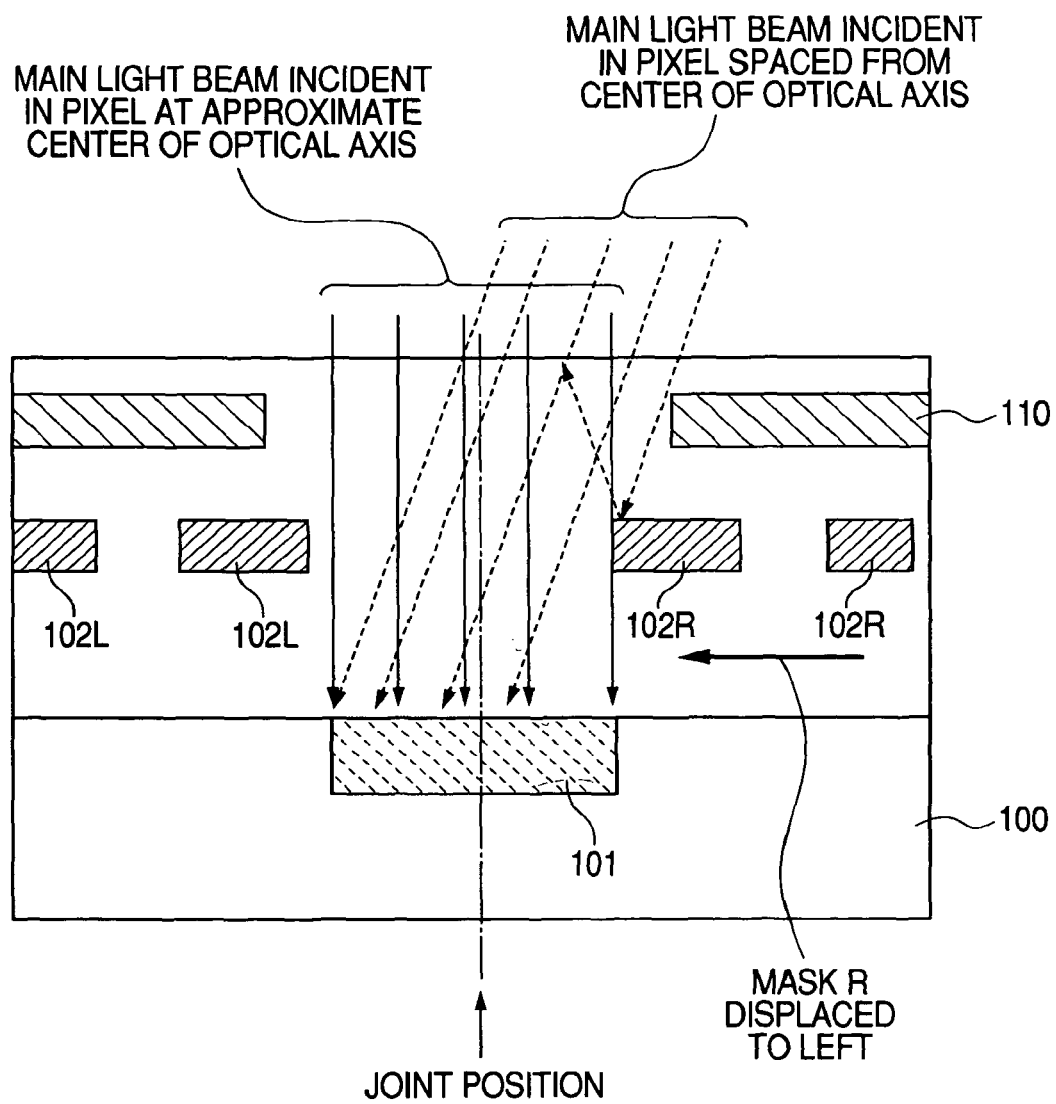
FIG. 14 is a diagram showing a state of a light beam incident in a pixel exposed with occurrence of the displacement to the right or left at the time of the divisional exposure.
Figure 15:
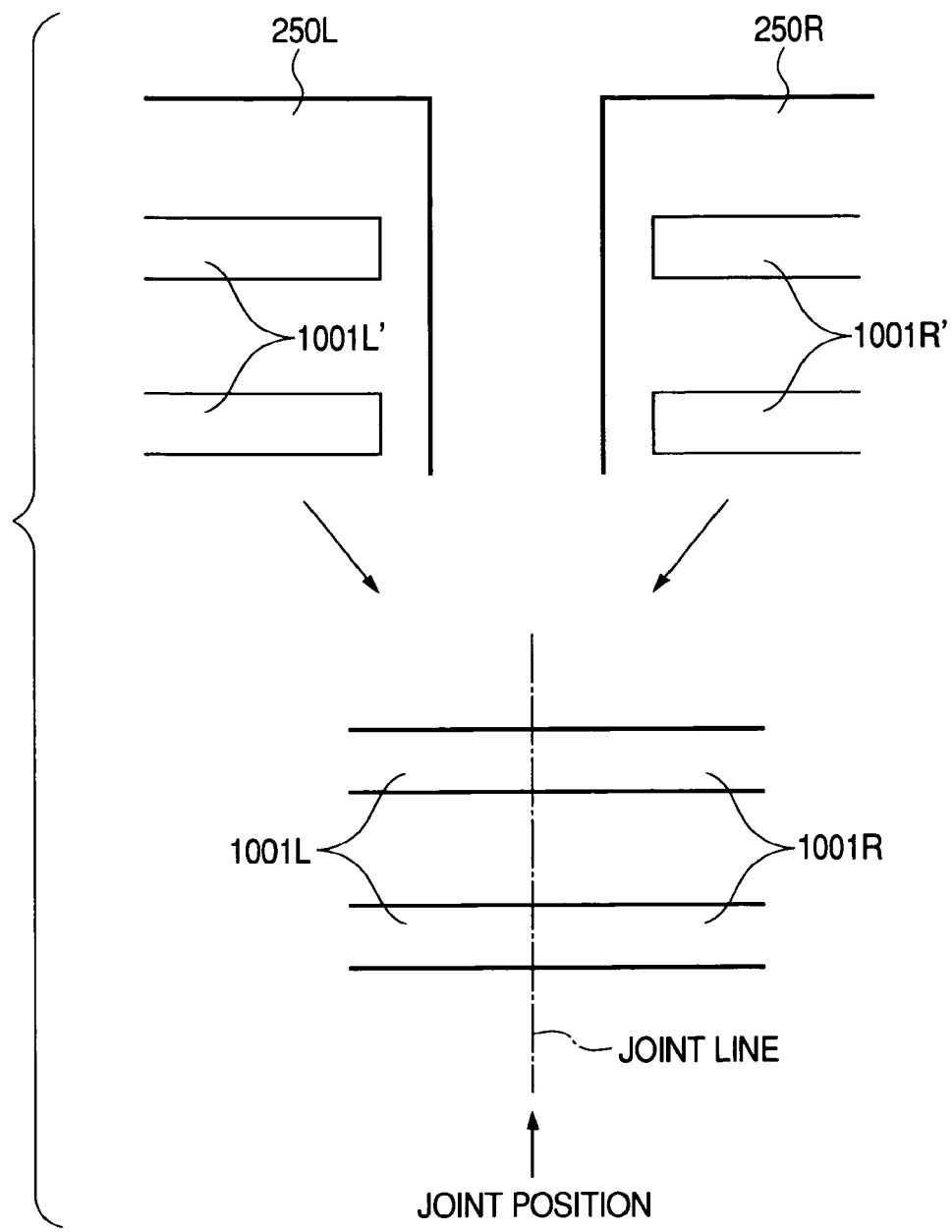
FIG. 15 is a diagram for explaining joint that is performed by the divisional exposure.

If the exposure could be performed without any displacement to the right or left at the time of the divisional exposure, as shown in FIG. 13, even if the joint line of the solid-state image pick-up apparatus; exists at the center of the optical axis of the lens and the light beam enters perpendicularly (shown by the arrows of the solid lines in the diagram) the PN junction area, or even if the joint line of the solid-state image pick-up apparatus is spaced from the center of the optical axis of the lens and the light beam enters the PN junction area in the oblique direction (shown by the arrows of the broken lines in the diagram), the light can enter the PN junction area without being obstructed by wiring patterns 102R and 102L. However, when the displacement to the right or left at the time of the divisional exposure of the wiring pattern 102 (102R, 102L) occurs and the wiring pattern 102R exposed by the right leticule is displaced to the left in the diagram, as shown in FIG. 14, if the joint line of the solid-state image pick-up apparatus exists at the center of the optical axis of the lens and the light beam enters perpendicularly (shown by arrows of solid lines in the diagram) the PN junction area, the light can enter the PN junction area without being obstructed by the wiring patterns 102R and 102L. However, if the joint line of the solid-state image pick-up apparatus is spaced from the center of the optical axis of the lens and the light beam enters the PN junction area in the oblique direction (shown by arrows of broken lines in the diagram), a part of the light is obstructed by the wiring pattern 102R and cannot enter the PN junction area.

Therefore, even when the displacement to the right or left at the time of the divisional exposure occurs, if the joint line of the solid-state image pick-up apparatus coincides with the approximate center of the optical axis of the lens, a change in incident light amount is small between the right and left sides of the joint position, so that the output level difference in the case of using the joint position as a boundary, the bright line, the black bar, or the like can be suppressed.

Even if the joint position of the solid-state image pick-up apparatus is not made to perfectly coincide with the center of the optical axis of the lens and the output level difference occurs at the joint position, the output level difference of such a degree that it cannot be visually confirmed in the image reproduced by the solid-state image pick-up element can be permitted. Therefore, if the output level difference lies within an allowable range, the joint position of the solid-state image pick-up apparatus and the center of the optical axis of the lens can be spaced from each other. A wording "the center of the optical axis of the lens is set onto the approximate joint position where the pattern layers were joined by the divisional exposure" also incorporates the case where the joint position of the solid-state image pick-up apparatus and the center of the optical axis of the lens are spaced from each other in the range where the output level difference is allowable. For example, according to experiments by the inventors et al. of the present invention, the output level difference cannot be visually confirmed in a range where the output level difference at the joint position does not exceed 1% of an output value at that time and, in this range, the joint position of the solid-state image pick-up apparatus and the center of the optical axis of the lens can be spaced from each other. According to experiments by the inventors et al. of the present invention, it has been found that a distance between the joint position and the center of the optical axis in the range where the output level difference does not exceed 1% is equal to, for example, 50 mm and to ±3.6 mm when a lens of an F value of 1.8 is used. In the case of a lens whose F value is larger than at least 1.8, it is desirable that the joint position coincides with the center of the optical axis in such a range.

Embodiments of the invention will be described in detail hereinbelow with reference to the drawings.

Figure 10:
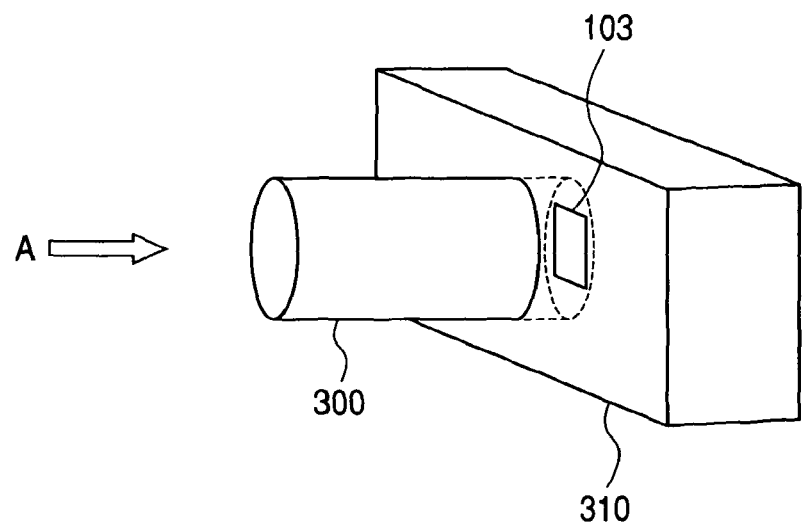
FIG. 10 is a diagram showing a constructional example of the still camera as a solid-state image pick-up apparatus.
Figure 11:
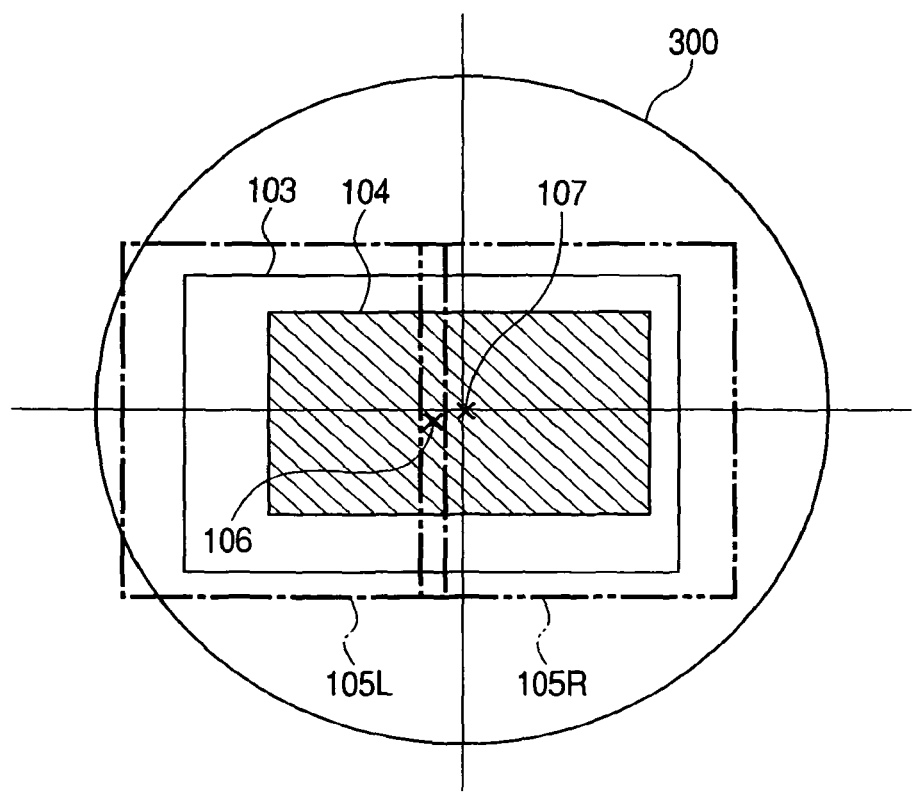
FIG. 11 is a diagram showing the case where a center of an optical axis of a lens of the still camera does not fall on a joint line of a joint position of a solid-state image pick-up element but the center of the optical axis is arranged in a position spaced from the joint line.

The invention relates to an image pick-up apparatus in which an image pick-up element and a lens for converging the light onto the image pick-up element are provided or a mount to arrange the lens in a position specified by the invention is equipped for an apparatus main body. Specifically speaking, a still camera, a video camera, or the like can be mentioned. The still camera as shown in FIG. 10 will be described as an example here.

Embodiment 1

Figure 1:
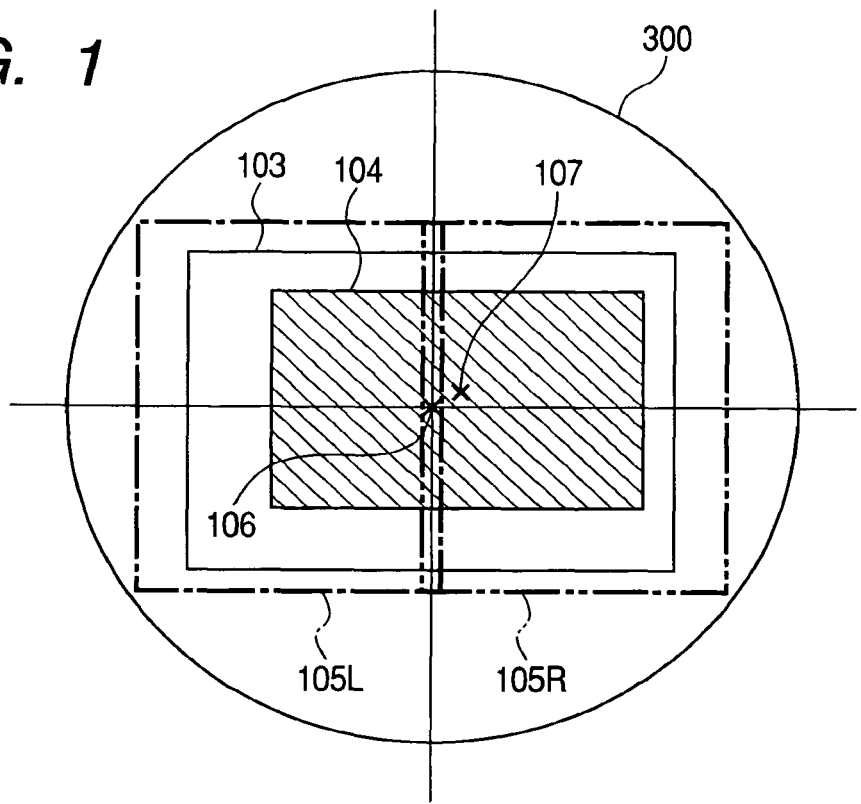
FIG. 1 is a diagram showing a layout of a lens and an image pick-up element in the first embodiment.

FIG. 1 is a diagram showing a layout of a lens and an image pick-up element in the first embodiment of an image pick-up apparatus of the invention.

In FIG. 1, reference numeral 103 denotes the image pick-up element in which at least one wiring layer or an impurity injection area of a wafer has been formed by the divisional exposure; 104 the effective pixel area (pixel area used as data to actually form an image excluding an optical black pixel area or the like); 107 a center of the effective pixel area; 105R the exposure range of the right reticule; and 105L the exposure range of the left reticule. The joining operation is executed in an overlapped portion of the exposure ranges 105R and 105L. In the embodiment, a layer where the divisional exposure is executed is assumed to be a wiring layer. As examples of the wiring layers, in a construction of a solid-state image pick-up element having a reset transistor, an amplifying transistor, and a selecting transistor every pixel, a controlling wiring, an output wiring, and the like of each transistor can be given. Such wirings can be also allocated to a plurality of wiring layers. For example, the controlling wiring of each transistor is allocated as a first layer, the output wiring is allocated as a second layer, and both layers are formed by the divisional exposure. The exposure to form contact holes and through holes for allowing the wiring layers to be come into contact with each other or allowing the substrate and the wirings to be come into contact with each other is also executed by the divisional exposure. Since those layers exert a large influence on the realization of fineness of the pixel and a large aperture ratio, it is preferable to form a fine pattern by the divisional exposure.

The lens 300 and the image pick-up element 103 are arranged so that the center of the optical axis of the lens 300 (crossing point of an alternate long and short dash line which crosses) is set onto the joint line of the joint position of the image pick-up element 103. Reference numeral 106 denotes a center of a chip. As already described above, by arranging the lens 300 and the image pick-up element 103 so that the center of the optical axis of the lens 300 (crossing point of an alternate long and short dash line which crosses) is set onto the joint line of the image pick-up element 103, even if the displacement to the right or left at the time of the divisional exposure occurs, when the joint line of the solid-state image pick-up apparatus coincides with the approximate center of the optical axis of the lens, a change in the light beam which enters a PN junction area 101 is small, so that the output level difference in the case of using the joint line as a boundary, the bright line, the black bar, or the like can be suppressed.

For example, since the joint position can be recognized as coordinates on the chip at the designing stage, to actually allow the joint position to coincide with the center of the optical axis, when the chip is assembled into the camera, it is preferable to position the chip and the lens on the basis of those coordinates and allow the center of the optical axis to coincide with the joint position.

Embodiment 2

Figure 2:
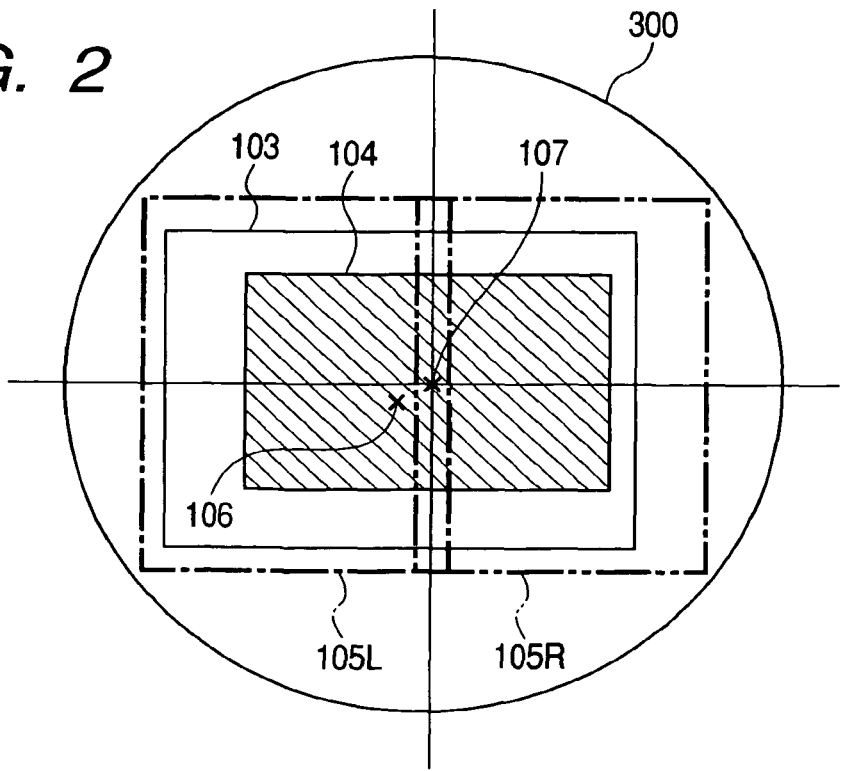
FIG. 2 is a diagram showing a layout of a lens and an image pick-up element in the second embodiment.

FIG. 2 is a diagram showing a layout of a lens and an image pick-up element in the second embodiment of an image pick-up apparatus of the invention. Substantially the same component elements as those shown in FIG. 1 are designated by the same reference numerals and their detailed description is omitted here.

In the second embodiment, reference numeral 106 denotes the center of the chip and the chip and the lens are arranged so that the center 107 of the effective pixel area and the center of the optical axis of the lens 300 of the image pick-up element overlap on the joint line. By arranging the chip and the lens so that the center of the optical axis of the lens 300 coincides with the center of the effective pixel area 104 of the image pick-up element 103, in addition to an effect described in the embodiment 1, such an effect that since the effective pixel area is arranged at the center of an image circle (range where an image of the light passing through the lens is formed at the position of a sensor surface) of the lens 300, the image circle can be effectively used is obtained.

Embodiment 3

Figure 3:
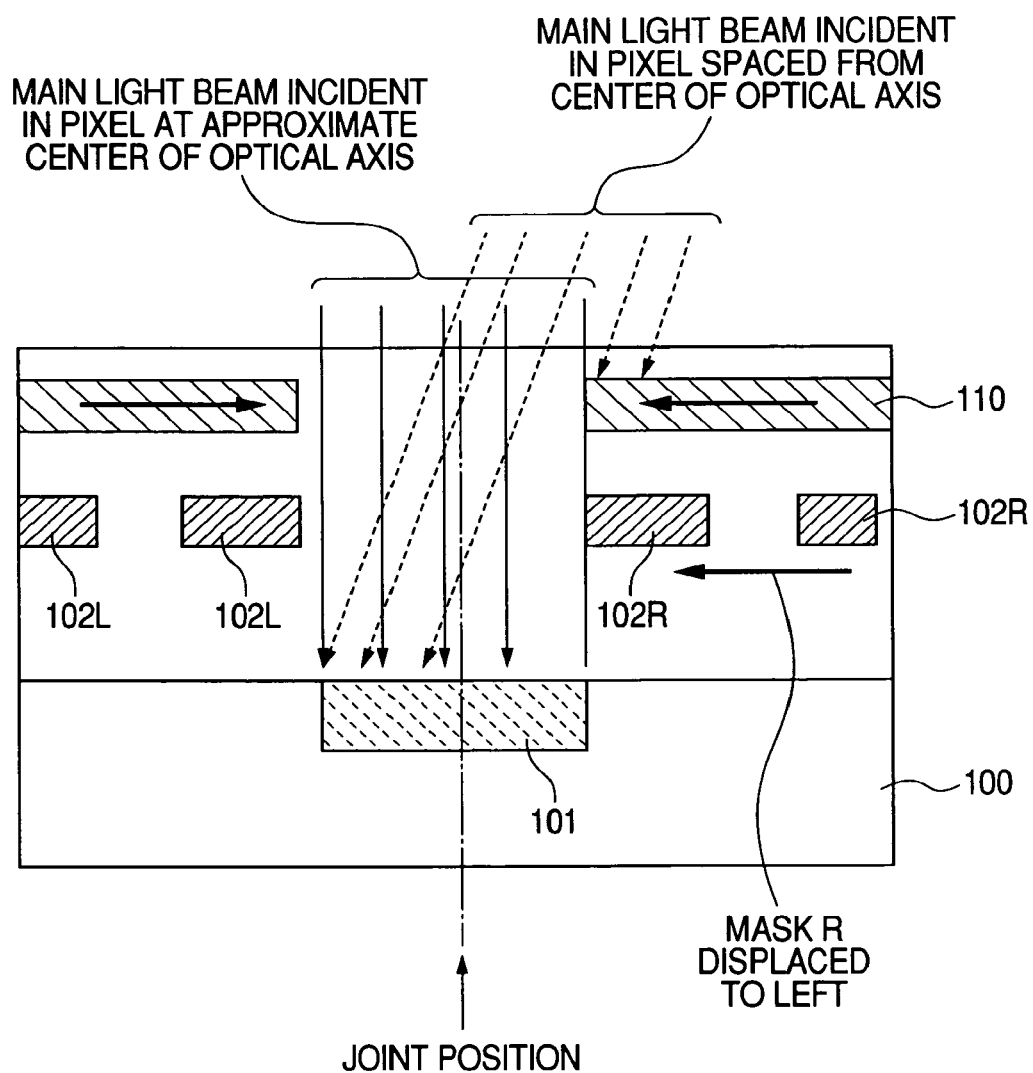
FIG. 3 is a diagram showing a principle of the third embodiment.
Figure 4:
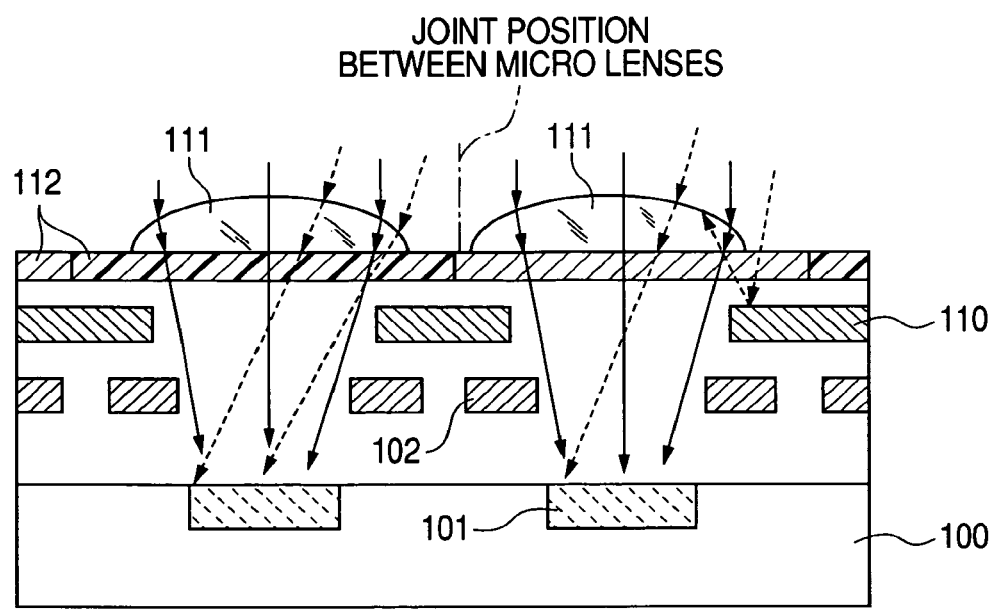
FIG. 4 is a diagram showing the principle of the third embodiment.

FIG. 3 is a diagram for explaining the third embodiment of an image pick-up apparatus of the invention. FIG. 4 is a diagram showing a layout of a lens and an image pick-up element in the third embodiment of an image pick-up apparatus of the invention. Substantially the same component elements in FIGS. 3 and 4 are designated by the same reference numerals and will be explained.

The output level difference which is caused by mask displacement of the wiring pattern 102 formed by the exposure in a joined fashion can be avoided to a certain degree as shown in FIG. 3 by narrowing a light shielding layer 110 as an upper layer of the wiring pattern 102 so as to have a margin of the light shielding layer 110. In FIG. 3, the joint position shows the joint position between the wiring patterns. Since an amount of the incident light beam is limited by the light shielding layer 110 by narrowing the light shielding layer 110 as shown in FIG. 3, even if the wiring patterns 102R exposed by the right leticule are displaced to the left, its influence is small. However, in the case where the layers over the light shielding layer are formed by the exposure in a joined fashion, it is difficult to avoid the joint displacement by the process for narrowing the light shielding layer 110.

In the embodiment, the joint position in the layers over the light shielding layer is made to coincide with the center of the optical axis of the lens. As layers over the light shielding layer, for example, a micro lens layer (first lens layer) and an inner lens layer (second lens layer) can be given. The inner lens layer is a lens layer which is arranged under the micro lens layer. For example, the micro lens layer is formed by patterning a resin and the inner lens layer is obtained by patterning a layer of SiN or the like. The exposure upon the above patterning is executed by the divisional exposure.

As shown in FIG. 4, the displacement between the right and left patterns is caused when the joint position at the time of the divisional exposure of micro lens layers 111 is used as a boundary. When the micro lens layer exposed by the right reticule is now displaced to the left in the diagram, as shown in FIG. 4, if the joint position between the micro lens layers exists at the center of the optical axis of the lens and the light beam enters perpendicularly (shown by arrows of solid lines in FIG. 4) the PN junction area, the light can be converged into the PN junction area even by the micro lens layers with the positional displacement. However, if the joint line between the micro lens layers is spaced from the center of the optical axis of the lens and the light beam enters the PN junction area in the oblique direction (shown by arrows of broken lines in the diagram), a part of the light cannot be converged into the PN junction area by the micro lens layer displaced to the left (micro lens layer of the right side in FIG. 4).

Therefore, even when the displacement to the right or left at the time of divisional exposure occurs, if the joint position between the micro lens layers coincides with the approximate center of the optical axis of the lens, a change in light beam converging state is small and the output level difference in the case of using the joint position as a boundary, the bright line, the black bar, or the like can be suppressed. Therefore, for example, it is possible to construct in such a manner that, by dividing it into three or more portions, the finer divisional exposure is performed to the wiring layers which exist under the light shielding layer and in which high fineness is required and the 2-divisional exposure is performed to the micro lens layers which exist over the light shielding layer, thereby allowing the joint position to coincide with the center of the optical axis of the lens. In this case, the joint position does not always coincide with the center of the optical axis with respect to the wiring layers. This is true of the inner lens layers.

Embodiment 4

Figure 5:
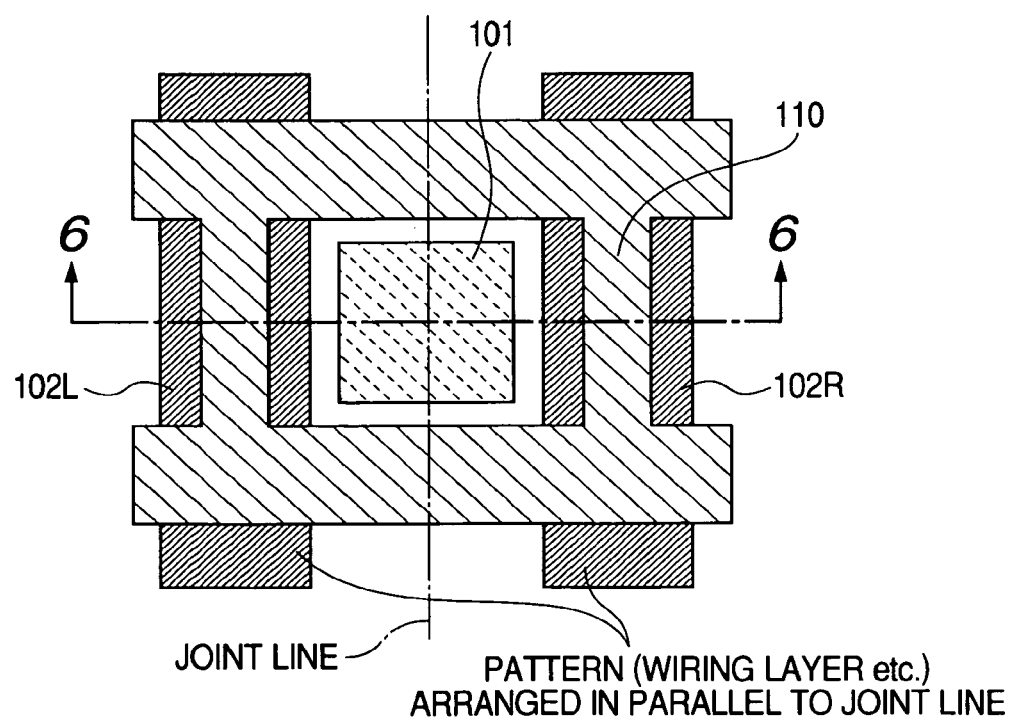
FIG. 5 is a plan view of a pixel in the fourth embodiment.
Figure 6:
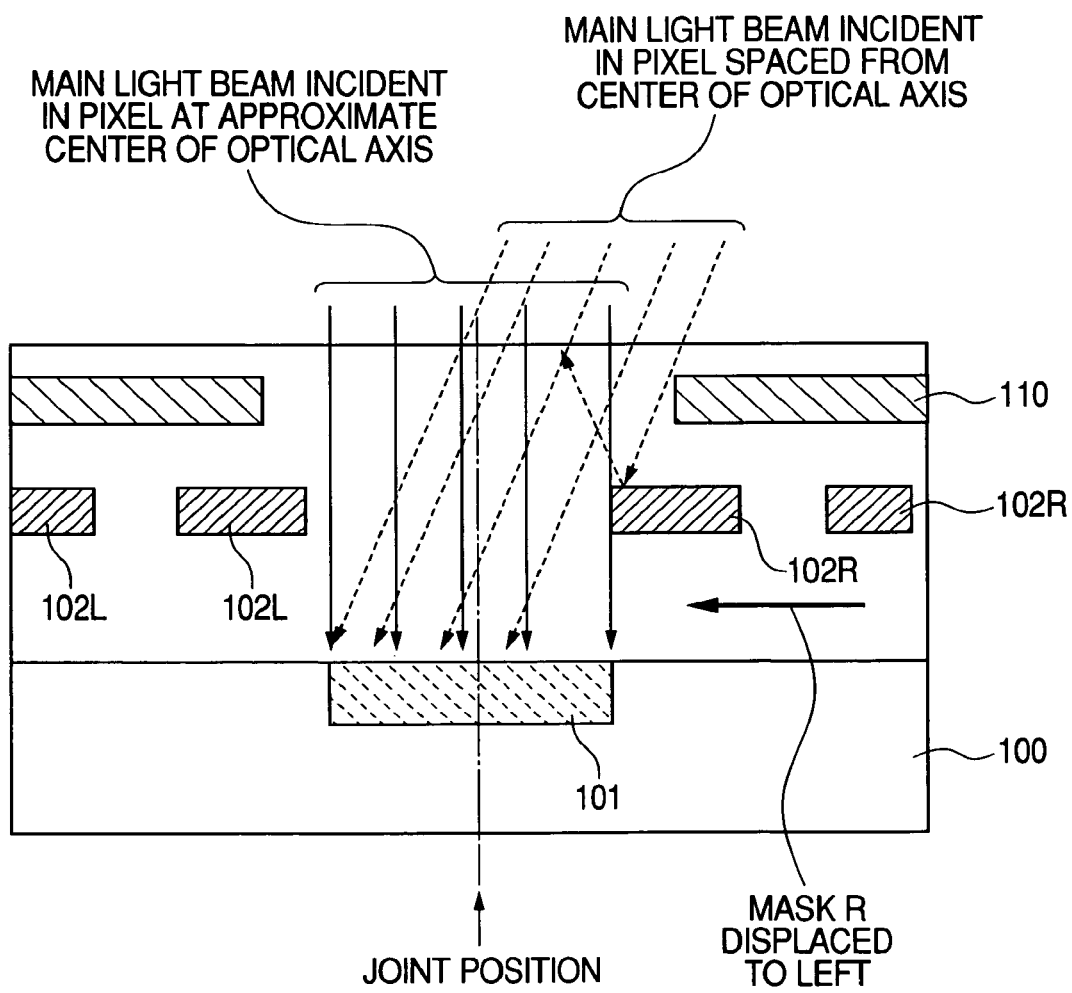
FIG. 6 is a diagram showing a layout of a lens and an image pick-up element in the fourth embodiment.

FIG. 5 is a plan view of a pixel in the fourth embodiment of an image pick-up apparatus of the invention and FIG. 6 is a diagram showing a layout of an image pick-up element. Substantially the same component elements in FIGS. 5 and 6 are designated by the same reference numerals and will be explained.

Layer patterns which are arranged in parallel with the joint line remarkably exert an influence of a sensitivity deviation as compared with layer patterns which are perpendicularly arranged. For example, as shown in FIGS. 5 and 6, if the wiring pattern 102R which is in parallel with the joint line and has been exposed by the right reticle is displaced to the left, a part of the main light beam which has been reflected by the wiring pattern 102R and is incident in the pixel spaced from the center of the optical axis does not enter the PN junction area 101. However, the influence on the wiring patterns which are perpendicularly arranged is small and a ratio of such an influence to causes of the sensitivity deviation of the pixel is small.

In the embodiment 4, therefore, the joint line between, for example, the wiring patterns which are arranged in parallel with the joint line is allowed to coincide with the approximate center of the optical axis of the lens.

Figure 7:
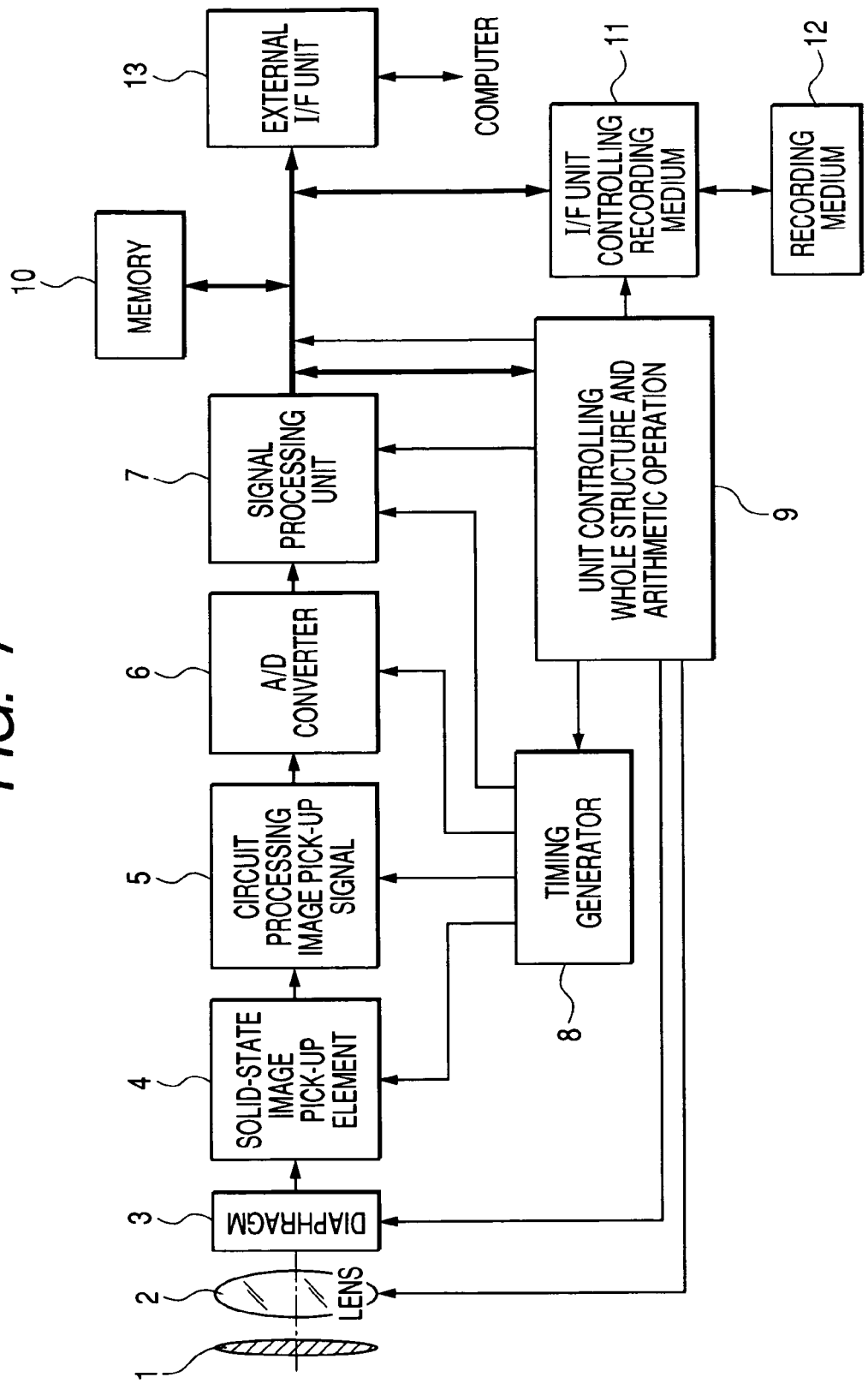
FIG. 7 is a block diagram showing a "still camera" as an example of a solid-state image pick-up apparatus of the invention.
Figure 8:
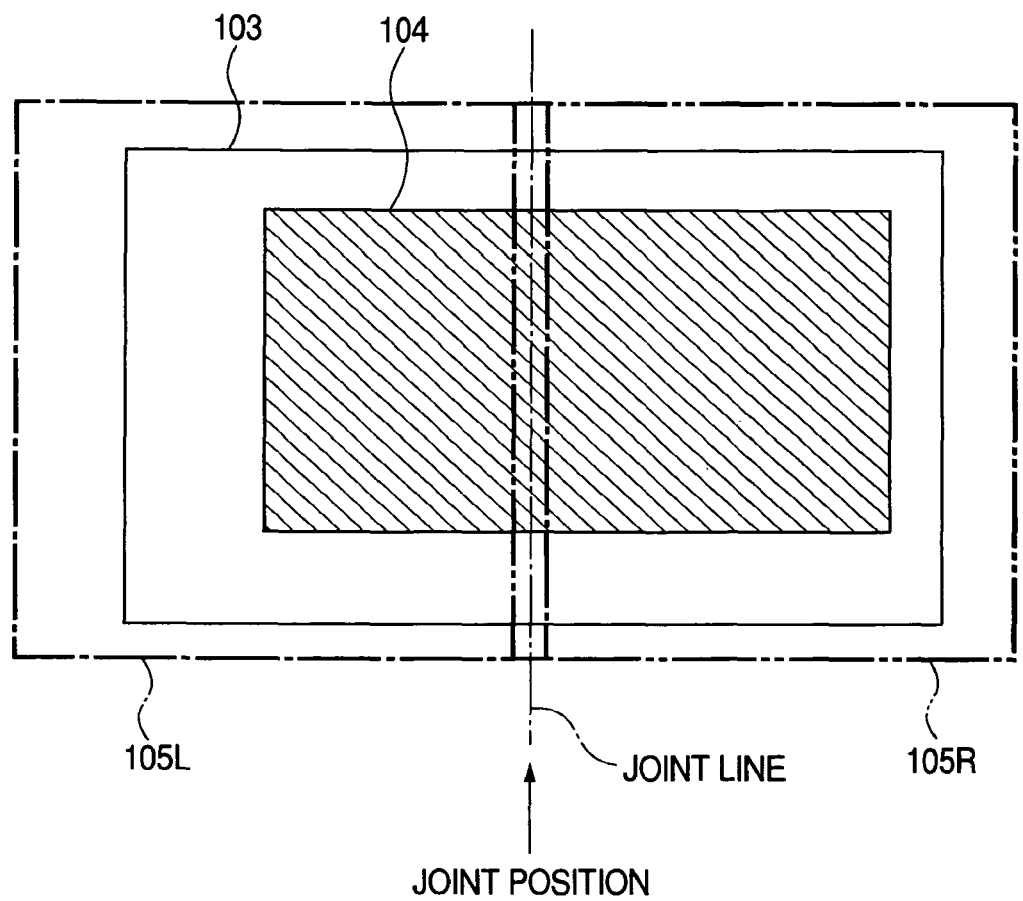
FIG. 8 is a diagram for explaining the case where an image pick-up element of a size larger than an exposure area of a reduction projecting apparatus is divided into halves and exposed.
Figure 9:
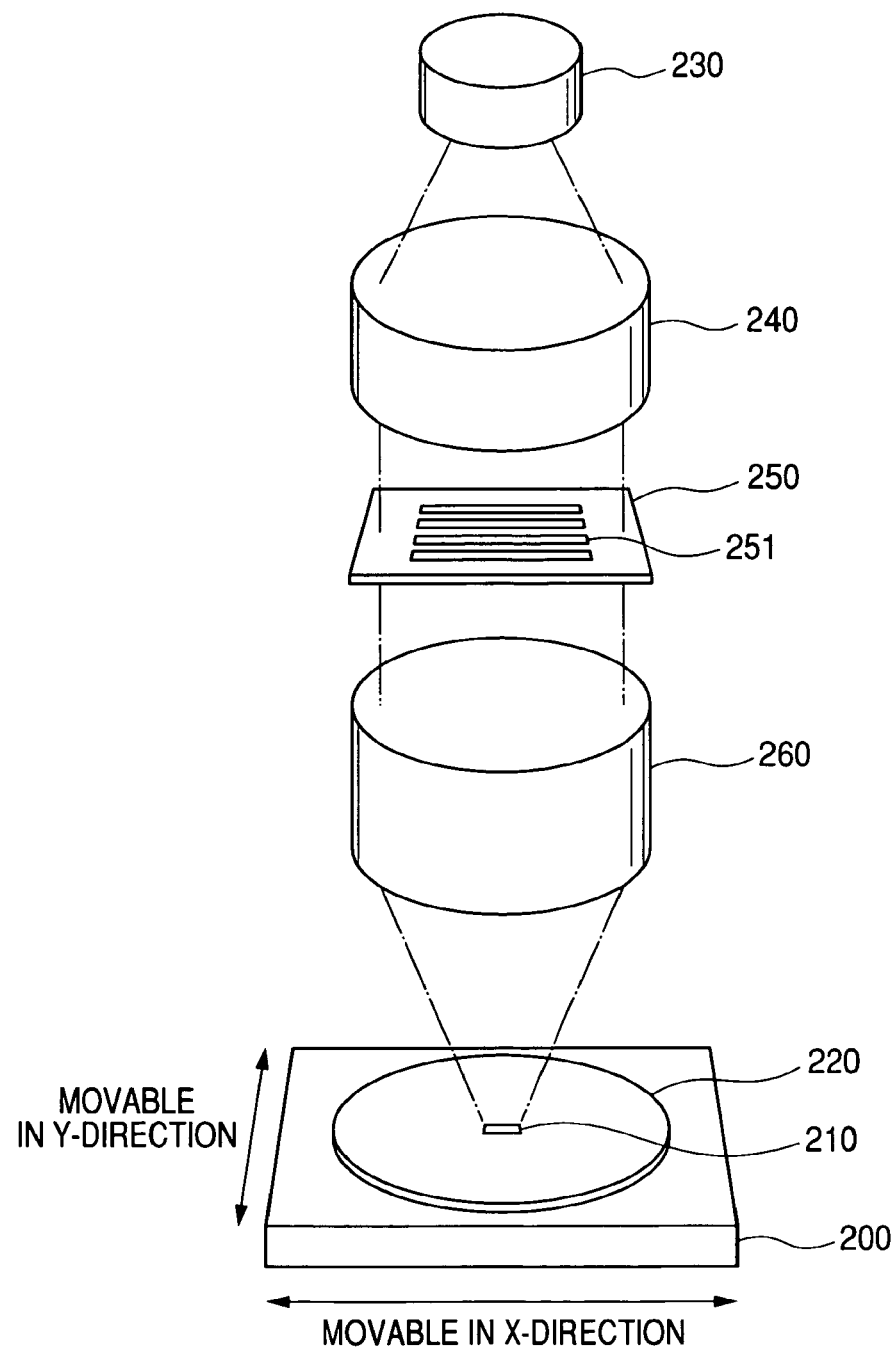
FIG. 9 is a diagram showing a schematic construction of the reduction projecting apparatus.

FIG. 7 is a block diagram showing a "still camera" as an example of a solid-state image pick-up apparatus of the invention.

In FIG. 7, reference numeral 1 denotes a barrier functioning as a device to protect the lens and as a main switch; 2 a lens for forming an optical image of an object onto a solid-state image pick-up element 4; 3 a diaphragm for varying an amount of light passing through the lens 2; 4 the solid-state image pick-up element for fetching the object whose image has been formed by the lens 2 as an image signal; 6 an A/D converter for converting the analog image signal that is outputted from the solid-state image pick-up element 4 into a digital signal; 7 a signal processing unit for executing various correcting processes to the image data outputted from the A/D converter 6 or compressing it; 8 a timing generator for generating various timing signals to the solid-state image pick-up element 4, a circuit 5 for processing the image pick-up signal; the A/D converter 6, and the signal processing unit 7; 9 a unit controlling whole structure and arithmetic operation for controlling various arithmetic operations and the whole still video camera; 10 a memory for temporarily storing the image data; 11 an interface (I/F) unit controlling recording medium for recording or reading out the image data onto/from the recording medium; 12 a detachable recording medium such as a semiconductor memory or the like for recording or reading out the image data; and 13 an external I/F unit for communicating with an external computer or the like. As a construction of the image pick-up apparatus, a construction in which the lens is integrated and a positional relation among those component elements including the lens is specified in the invention can be used, or a construction having a mount for arranging a lens for exchange so as to obtain the positional relation specified in the invention can be also used. Specifically speaking, such a mount is provided as a member for connecting the lens to the solid-state image pick-up apparatus 310 in FIG. 10.

The operation of the still video camera upon photographing in the above construction will now be described.

When the barrier 1 is opened, a main power source is turned on. A power source of a control system is subsequently turned on. Further, a power source of an image pick-up system circuit such as an A/D converter 6 and the like is turned on.

To subsequently control an exposure amount, the unit controlling whole structure and arithmetic operation 9 opens the diaphragm 3. The signal outputted from the solid-state image pick-up element 4 is converted into the A/D converter 6 and, thereafter, inputted to the signal processing unit 7. The arithmetic operation of the exposure is executed by the unit controlling whole structure and arithmetic operation 9 on the basis of the data.

The brightness is discriminated on the basis of a result of the photometric operation. The unit controlling whole structure and arithmetic operation 9 controls the diaphragm 3 in accordance with a discrimination result.

Subsequently, high frequency components are extracted and an arithmetic operation of a distance to the object is executed by the unit controlling whole structure and arithmetic operation 9 on the basis of the signal outputted from the solid-state image pick-up element 4. After that, the lens is driven and whether or not an in-focus state has been obtained is discriminated. If it is determined that the in-focus state is not obtained, the lens is driven again and the photometric operation is executed.

After the in-focus state is confirmed, the main exposure is started. After completion of the exposure, the image signal outputted from the signal outputted from the solid-state image pick-up element 4 is A/D converted by the A/D converter 6. The converted digital signal passes through the signal processing unit 7 and written into the memory 10 by the unit controlling whole structure and arithmetic operation 9. After that, the data stored in the memory 10 passes through the I/F unit controlling recording medium 11 under the control of the unit controlling whole structure and arithmetic operation 9 and is recorded onto the detachable recording medium 12 such as a semiconductor memory or the like. It is also possible to construct in such a manner that the data passes through the external I/F unit 13 and is directly inputted to a computer or the like and the image is modified.

This application claims priority from Japanese Patent Application No. 2004-030814 filed on Feb. 6, 2004, which is hereby incorporated by reference herein.

What is claimed is:

1. A manufacturing method of an image pick-up apparatus that includes:
   a solid-state image pick-up element including a substrate provided with an effective pixel area smaller than the solid-state image pick-up element and a plurality of layers including a first pattern layer and a second pattern layer, and an image pick-up lens for converging light onto the effective pixel area of the solid-state image pick-up element, the method comprising:
   forming the first pattern layer by a non-divisional exposure;
   forming the second pattern layer by a divisional exposure including a first exposure and a second exposure, such that an area of the first exposure and an area of the second exposure partially overlap, in a first direction, at a partially overlapped portion including a joint line, wherein the joint line is offset from a center position of the effective pixel area, the center position being equidistant in the first direction from outermost edges of the effective pixel area; and setting an optical axis of the image pick-up lens to be positioned at the joint line.

2. The manufacturing method according to claim 1, wherein,
in the forming step, the joint position of the divisional exposure is set at a center of an effective pixel area including a plurality of pixels, having at least the photoelectric converting areas of the solid-state image pick-up device.

3. The manufacturing method according to claim 2, wherein,
in the setting step, a distance from the center of the effective pixel area, which includes the plurality of pixels having at least the photoelectric converting areas of the solid-state image pick-up device, to the optical axis of the image pick-up lens is larger than a distance from the joint position of the divisional exposure to the optical axis of the image pick-up lens.

4. The manufacturing method according to claim 1, wherein the solid-state image pick-up device includes a light shielding layer, and the pattern layer is formed above the light shielding layer.

5. The manufacturing method according to claim 1, wherein the pattern layer is a micro lens layer.

6. The manufacturing method according to claim 1, wherein the pattern layer is a wiring pattern arranged approximately in parallel with the joint position.

7. The manufacturing method according to claim 1, wherein
an output level difference at the partially overlapped portion of the solid-state image pick-up element is within 1 percent of an output value at a time of output.

8. A manufacturing method of an image pick-up apparatus that includes:
a solid-state image pick-up element including a substrate provided with an effective pixel area smaller than the solid-state image pick-up element and a plurality of layers including a first layer and a second, and
a mount for fixing an image pick-up lens for condensing light into the plurality of photoelectric converting areas of the solid-state image pick-up element, the method comprising:
forming the first pattern layer by a non-divisional exposure;
forming the second pattern layer by a divisional exposure including a first exposure and a second exposure, such that an area of the first exposure and an area of the second exposure partially overlap, in a first direction, at a partially overlapped portion including a joint line, wherein the joint line is offset from a center position of the effective pixel area, the center position being equidistant in the first direction from outermost edges of the effective pixel area; and
arranging the solid-state image pick-up element in relation to the mount, to set an optical axis of the image pick-up lens to be positioned at the joint line.

9. The manufacturing method according to claim 8, wherein, in the forming step, the joint position of the divisional exposure is set at a center of an effective pixel area including a plurality of pixels having at least the photoelectric converting areas of the solid-state image pick-up device.

10. The manufacturing method according to claim 9, wherein, in the arranging step, a distance from the center of the effective pixel area, which includes the plurality of pixels having at least the photoelectric converting areas of the solid-state image pick-up device, to the optical axis of the image pick-up lens is larger than a distance from the joint position of the divisional exposure to the optical axis of the image pick-up lens.

11. The manufacturing method according to claim 9, wherein the pattern layer is a hole layer including a plurality of holes for connecting between wirings, or between a wiring and the substrate.

12. The manufacturing method according to claim 8, wherein the solid-state image pick-up device includes a light shielding layer, and the pattern layer is formed above the light shielding layer.

13. The manufacturing method according to claim 8, wherein the pattern layer is a micro lens layer.

14. The manufacturing method according to claim 8, wherein the pattern layer is a wiring pattern arranged approximately in parallel with the joint position.

15. The manufacturing method according to claim 8, wherein
the pattern layer is a hole layer including a plurality of holes for connecting between wirings, or between a wiring and the substrate.

16. A manufacturing method of an image pick-up apparatus that includes
a solid-state image pick-up element including a substrate provided with an effective pixel area smaller than the solid-state image pick-up element and a plurality of layers including a first pattern layer and a second pattern layer, and
an image pick-up lens for introducing light into the effective pixel area of the solid-state image pick-up element,
the method comprising:
forming the first pattern layer among the plurality of pattern layers by a divisional exposure including a first exposure and a second exposure, such that an area of the first exposure and an area of the second exposure partially overlap, in a first direction, at a first partially overlapped portion including a first joint line, wherein the first joint line is offset from a center position of the effective pixel area, the center position being equidistant in the first direction from outermost edges of the effective pixel area;
forming the second pattern layer different from the first pattern layer among the plurality of pattern layers by a divisional exposure including a third exposure and a fourth exposure, such that an area of the third exposure and an area of the fourth exposure partially overlap at a second partially overlapped portion including a second joint line; and
setting an optical axis of the image pick-up lens approximately at the first joint line and not at the second joint line.

17. A manufacturing method of an image pick-up apparatus that includes a solid-state image pick-up element provided with an effective pixel area smaller than the solid-state image pick-up element arranged on a substrate and a wiring layer, and an image pick-up lens for converging light onto said solid-state image pick-up element, the method comprising:
forming the wiring layer by a divisional exposure including a first exposure and a second exposure, such that an area of the first exposure and an area of the second exposure partially overlap, in a first direction, at a partially overlapped portion including a joint line, wherein the joint line is offset from a center position of the effective pixel area, the center position being equidistant in the first direction from outermost edges of the effective pixel area; and placing the solid-state image pick-up element, to set an optical axis of the image pick-up lens approximately at the joint line.

18. The manufacturing method according to claim 17, wherein the joint position of the divisional exposure is set at a center of an effective pixel area including a plurality of pixels having at least the photoelectric converting areas of the solid-state image pick-up device.

19. The manufacturing method according to claim 17, wherein a pattern of the wiring layer is arranged approximately in parallel with the joint position.

20. The manufacturing method according to claim 17, wherein the wiring layer is arranged approximately at a periphery of an optical path of a light incident onto the photoelectric converting areas.

21. A manufacturing method of an image pick-up apparatus that includes a solid-state image pick-up element provided with an effective pixel area smaller than the solid-state image pick-up element arranged on a substrate, and a hole layer including a plurality of holes for connection between wirings or between the substrate and a wiring, and an image pick-up lens for converging light onto the solid-state image pick-up element, the method comprising:

forming the hole layer by a divisional exposure including a first exposure and a second exposure, such that an area of the first exposure and an area of the second exposure partially overlap, in a first direction, at a partially overlapped portion including a joint line, wherein the joint line is offset from a center position of the effective pixel area, the center position being equidistant in the first direction from outermost edges of the effective pixel area; and positioning the solid-state image pick-up element to set an optical axis of the image pick-up lens approximately at the joint line.

22. A manufacturing method of an image pick-up apparatus that includes a solid-state image pick-up element provided with an effective pixel area smaller than the solid-state image pick-up element arranged on a substrate and a wiring layer, and a mount for arranging an image pick-up lens for converging light onto the solid-state image pick-up element, the method comprising:

forming the wiring layer by a divisional exposure including a first exposure and a second exposure, such that an area of the first exposure and an area of the second exposure partially overlap, in a first direction, at a partially overlapped portion including joint line, wherein the joint line is offset from a center position in the effective pixel area; and positioning the mount and the solid-state image pick-up element to set an optical axis of the image pick-up lens approximately at the joint line.

23. The manufacturing method according to claim 22, wherein the joint position of the divisional exposure is set at a center of an effective pixel area including a plurality of pixels having at least the photoelectric converting areas of the solid-state image pick-up device.

24. The manufacturing method according to claim 22, wherein a pattern of the wiring layer is arranged approximately in parallel with the joint position.

25. The manufacturing method according to claim 22, wherein the wiring layer is arranged approximately at a periphery of an optical path of a light incident onto the photoelectric converting areas.

\* \* \* \* \*